US007128582B2

(12) United States Patent
Fang et al.

(10) Patent No.: US 7,128,582 B2
(45) Date of Patent: Oct. 31, 2006

(54) ELECTRICAL CONNECTOR WITH A SET-IN PRINTED CIRCUIT BOARD

(75) Inventors: Hesheng Fang, Kunsan (CN); Guohua Zhang, Kunsan (CN); ZiQiang Zhu, Kunsan (CN)

(73) Assignee: Hon Hai Precision Ind. Co., Ltd, Taipei Hsien (TW)

( * ) Notice: Subject to any disclaimer, the term of this patent is extended or adjusted under 35 U.S.C. 154(b) by 0 days.

(21) Appl. No.: 11/025,342

(22) Filed: Dec. 28, 2004

(65) Prior Publication Data

US 2005/0148218 A1 Jul. 7, 2005

(30) Foreign Application Priority Data

Jan. 6, 2004 (CN) ........................ 2004 2 0024153

(51) Int. Cl.
*H01R 12/00* (2006.01)
*H05K 1/00* (2006.01)

(52) U.S. Cl. ......................... 439/79; 439/362; 439/567

(58) Field of Classification Search .................. 439/79, 439/362, 571, 567
See application file for complete search history.

(56) References Cited

U.S. PATENT DOCUMENTS

| | | | | |
|---|---|---|---|---|
| 4,600,256 | A * | 7/1986 | Anttila | 439/65 |
| 4,686,506 | A * | 8/1987 | Farago | 341/100 |
| 5,069,641 | A | 12/1991 | Sakamoto et al. | |
| 5,194,010 | A | 3/1993 | Dambach et al. | |
| 5,249,974 | A * | 10/1993 | Wang | 439/79 |
| 5,344,342 | A * | 9/1994 | Briones | 439/620 |
| 5,687,233 | A * | 11/1997 | Loudermilk et al. | 379/442 |
| 5,797,769 | A | 8/1998 | Yang et al. | |
| 6,135,819 | A * | 10/2000 | Lin | 439/620 |
| 6,171,142 | B1 * | 1/2001 | Wang et al. | 439/567 |
| 6,174,198 | B1 * | 1/2001 | Wu et al. | 439/541.5 |
| 6,179,668 | B1 | 1/2001 | Kan | |
| 6,305,987 | B1 * | 10/2001 | Crane et al. | 439/676 |
| 6,450,837 | B1 * | 9/2002 | Givens et al. | 439/620 |
| 6,527,564 | B1 * | 3/2003 | Yeh | 439/76.1 |
| 6,527,594 | B1 | 3/2003 | Korsunsky et al. | |
| 6,554,642 | B1 * | 4/2003 | Xiang et al. | 439/567 |

* cited by examiner

*Primary Examiner*—Hae Moon Hyeon
(74) *Attorney, Agent, or Firm*—Wei Te Chung

(57) ABSTRACT

An electrical connector (1) has an insulative housing (10) having a D-shaped mating portion (11), a number of first and second contacts (21, 22) received in the housing, and a metal shell (50) surrounds the mating portion of the housing. An inner printed circuit board (30) is assembled to the housing and connects the first and second contacts. The first and second contacts are electrical connecting with a complementary connector and an outer printed circuit board, respectively. The housing of the connector further has a pair of flanges (13) and a receiving space (16) defined between the flanges. The inner PCB defines a set of filter devices received in the receiving space.

17 Claims, 4 Drawing Sheets

ELECTRICAL CONNECTOR WITH A SET-IN PRINTED CIRCUIT BOARD

BACKGROUND OF THE INVENTION

1. Field of the Invention

The present invention generally relates to the art of electrical connectors, and particularly to a D-Sub electrical connector for mounting on a printed circuit board.

2. Description of Prior Arts

A conventional D-Sub electrical connector comprises an insulative housing having a D-shaped mating portion and a plurality of terminals received in the housing. A metal shell often surrounds a substantial portion of the housing to protect at least the mating portions of the contacts from RF (Radio Frequency) and EMI (Electro Magnetic Interference) as well as to protect the surrounding from interference radiating from the connector, itself.

A video graphics array (VGA) interface connector mounting on a motherboard or a graphic card is a typical kind of D-Sub electrical connector with fifteen terminals arranged in three rows. A common problem to the VGA connectors is their tendency to generate noise during transmission of electrical signals. Conventionally, noise suppressors, such as filters, are mounted on the motherboard or the graphic card on which the VGA connector is seated to suppress the noise. However, such noise suppressors consume board real estate, which could otherwise be used for other circuitry.

Hence, it is desirable to have an improved electrical connector to overcome the above-mentioned disadvantages of the prior art.

SUMMARY OF THE INVENTION

It is an object of the present invention to provide an electrical connector including a printed circuit board assembled therein.

In order to achieve the above-mentioned object, an electrical connector in accordance with the prior art comprises an insulative housing having a D-shaped mating portion, a plurality of first and second contacts received in the housing, and a metal shell surrounds the mating portion of the housing. An inner printed circuit board (PCB) is assembled to the housing and connects the first and second contacts. The first and second contacts are electrical connecting with a complementary connector and an outer PCB, respectively. The housing of the connector further has a pair of flanges and a receiving space defined between the flanges. The inner PCB defines a set of filter devices received in the receiving space.

Other objects, advantages and novel features of the invention will become more apparent from the following detailed description of the present embodiment when taken in conjunction with the accompanying drawings.

DETAILED DESCRIPTION OF THE PREFERRED EMBODIMENT

Figure 1:
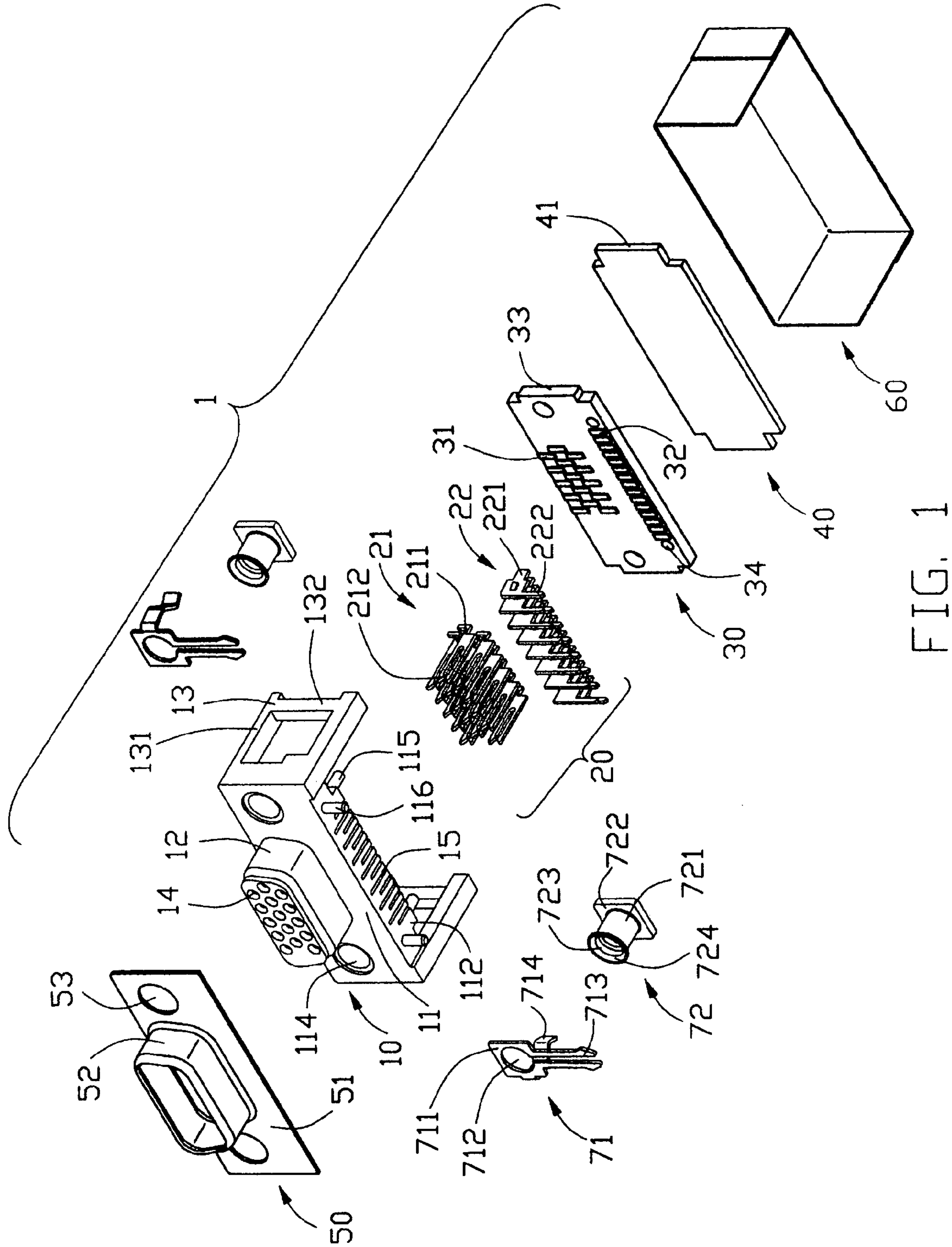
FIG. 1 is an exploded, perspective view of an electrical connector in accordance with the present invention.

Reference will now be made to the drawing figures to describe the present invention in detail.

Figure 2:
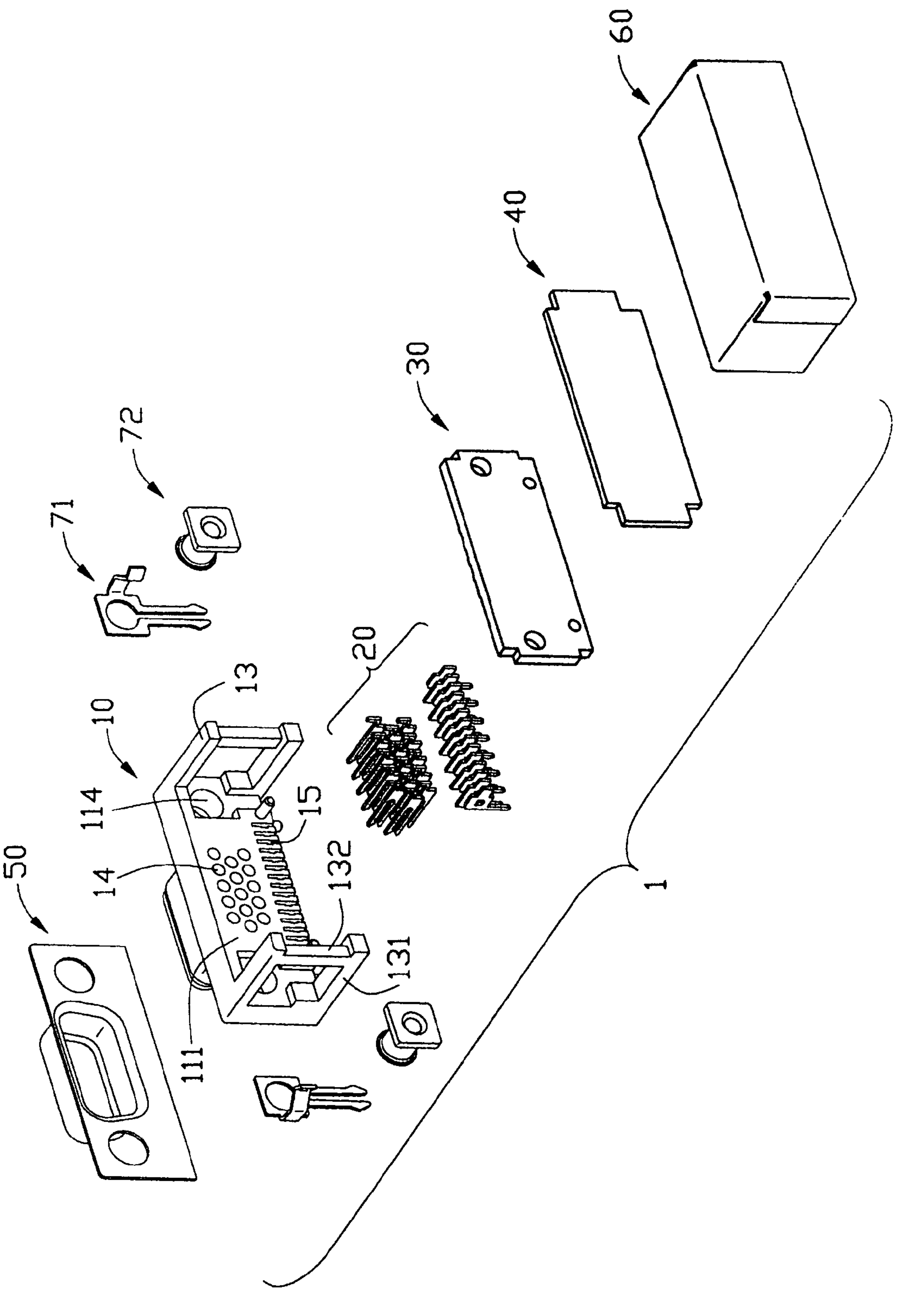
FIG. 2 is a view similar to FIG. 1, but taken from a different perspective.
Figure 3:
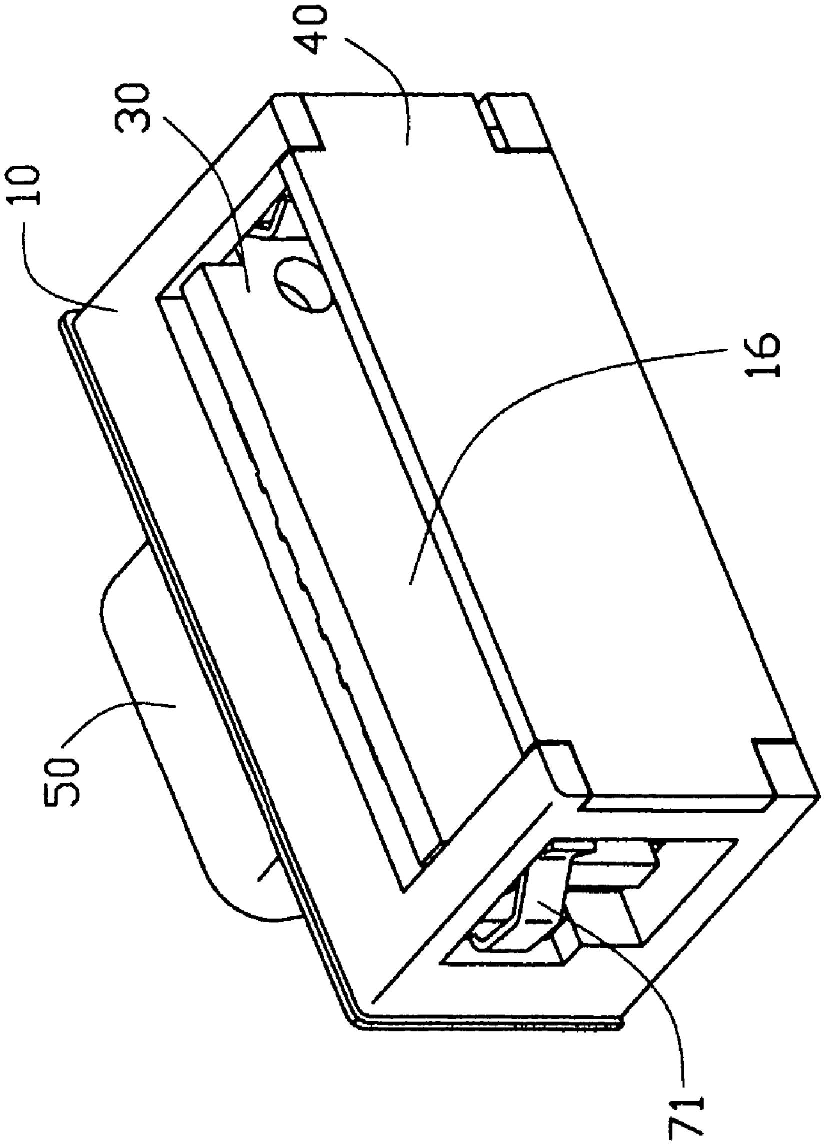
FIG. 3 is an assembled perspective view of the electrical connector of FIG. 2 without a rear shell.
Figure 4:
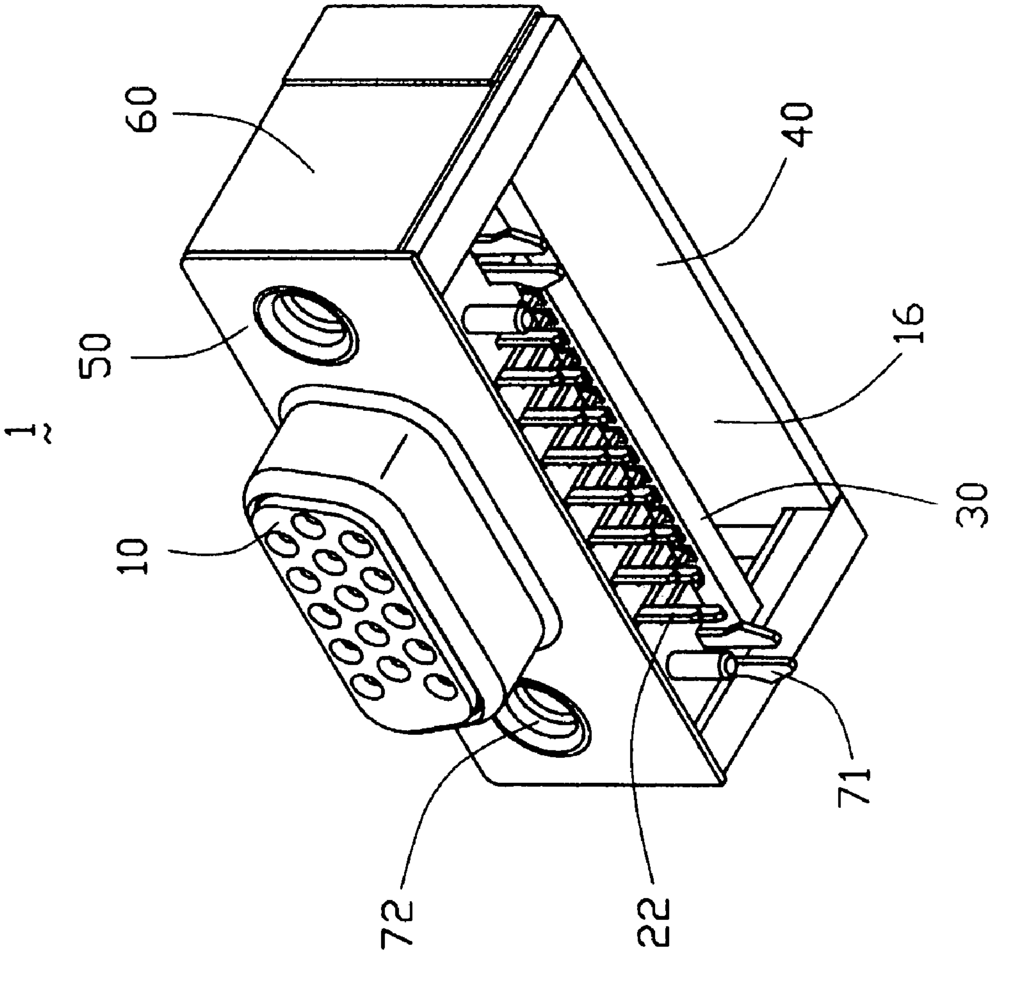
FIG. 4 is an assembled perspective view of the electrical connector of FIG. 1.

With reference to FIGS. 1 to 4, an electrical connector in accordance with the present invention is a D-Sub electrical connector 1 for mounting on an outer printed circuit board (PCB, not shown). The connector 1 comprises an insulating housing 10, a plurality of contacts 20, an inner PCB 30, a spacer 40, a front shell 50, a rear shell 60, a pair of board locks 71 and a pair of fasteners 72.

The housing 10 comprises a base portion 11, a D-shaped mating portion 12 extending forwardly from the base portion 11, a pair of flanges 13 extending rearwardly from opposite sides of the base portion 11 and a receiving space 16 defined between the flanges 13. The base portion 11 defines a rear terminating face 111 and a bottom mounting face 112. A pair of apertures 114 extend through the base portion 11 in a front-to-back direction. The base portion 11 further defines a pair of posts 115 extending rearwardly from the terminating face 111 and a pair of posts 116 extending downwardly from the mounting face 112 for insertion into appropriate mounting holes in the outer PCB. Each flange 13 includes a pair of horizontal beams 131 extending from the base portion 11 and a vertical beam 132 connecting the horizontal beams 131. The housing 10 further defines a plurality of first passageways 14 extending through the base portion 11 and the mating portion 12 in the front-to-back direction, and a plurality of second passageways 15 penetrating through the terminating face 111 and the mounting face 112.

The contacts 20 include two groups, first contacts 21 and L-shaped second contacts 22. The first contacts 21 are received in the first passageways 14, and include contact portions 212 for electrically connecting with a complementary electrical connector (not shown) which mates with the connector 1 and tail portions 211 projecting rearwardly beyond the terminating face 111 of the housing 10. The second contacts 22 are received in the second passageways 15, and include tail portions 221 projecting rearwardly beyond the terminating face 111 of the housing 10 and leg portions 222 projecting downwardly from the mounting face 112 of the housing 10 for electrically connecting with circuit traces on the outer PCB.

The front shell 50 is a unitary structure stamped and formed of sheet metal material. The front shell 50 includes a main generally planar portion 51 that abuts against a front face of the base portion 11 of the housing 10. A shroud 52 projects forward from the planar portion 51 and surrounds the mating portion 12 of the housing 10 and the contact portions 212 of the first contacts 21. The planar portion 51 defines a pair of through holes 53 aligned with the corresponding apertures 113 of the housing 10, respectively.

Each board lock 71 is stamped and formed of sheet metal material and includes a square-shaped, generally planar mounting plate 711 adapted for bearing against the terminating face 111 of the housing 10. The mounting plate 711 has an opening 712. A pair of locking legs 713 extend downwardly from the mounting plate 711 and project below the mounting face 112 of the housing 10 for insertion into an appropriate mounting hole in the outer PCB. Each board lock 71 further includes an S-shaped retaining tab 714 extending laterally and rearwardly from the mounting plate 711.

Each fastener 72 includes a shank portion 721 extending through the opening 712 of the board lock 71, the aperture 114 of the housing 10 and the through hole 53 of the front shell 50. The shank portion 721 is hollow and defines a screw thread 723 extending therethrough for engaging with appropriate fastening means of the complementary connector. Each fastener 72 further includes a square rear head 722 for sandwiching the mounting plate 711 between the rear head 722 and the terminating face 111 of the housing 10, and a circular front head 724 for sandwiching the front shell 50 between the front head 724 and the front face of the housing 10.

The inner PCB 30 is assembled to the terminating face 111 of the housing 10, and includes a pair of locating holes 34 for receiving the posts 115 of the housing 10, and a pair of side wings 33 retained by the flanges 13 of the housing 10 and the retaining tabs 714 of the board locks 71. The inner PCB 30 has first and second conductive areas 31, 32 thereon for electrically connecting with corresponding tail portions 211, 222 of the first and second contacts 21, 22, respectively. A set of noise suppressors (not shown) are mounted on the inner PCB 30 and accommodated in the receiving space 16 of the housing 10, and each first conductive area 31 electrically connects with a corresponding second conductive area 32 via the noise suppressors. Thereby, the electrical signals transmit from the first contacts 21 to the second contacts 22 via the inner PCB 30. In a preferred embodiment of the present invention, the noise suppressors are a set of filter devices.

The spacer 40 is a planar board and assembled to the housing 10. The spacer defines a pair of side wings 41 engaged between corresponding horizontal beams 131 and vertical beams 132 of the flanges 13 of the housing 10, respectively.

The rear shell 60 is attached to the housing 10 and covers the top, opposite sides and rear of the housing 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

We claim:

1. An electrical connector mounting on an outer printed circuit board (PCB) comprising:

an insulative housing comprising a base portion having a rear terminating face and a bottom mounting face, a D-shaped mating portion extending from the base portion, a plurality of first passageways extending through the rear terminating face of the base portion and the mating portion, and a plurality of second passageways defined in the rear terminating face and the bottom mounting face of the base portion;

an inner PCB;

a plurality of first and second contacts received in the first and second passageways, respectively, the first contacts being adapted for electrically connecting a complementary connector, the second contacts being adapted for electrically connecting the outer PCB, the first and the second contacts electrically connecting with each other via the inner PCB; and at least one board lock mounting on the housing for retaining the connector on the outer PCB, the board lock defines at least one spring tab for engaging the inner PCB on the housing.

2. The electrical connector as described in claim 1, wherein the housing comprises a pair of flanges extending rearwardly from opposite sides of the base portion, the inner PCB received between the pair of flanges.

3. The electrical connector as described in claim 2, wherein the flange comprises a pair of horizontal beams and a vertical beam connecting with the horizontal beams.

4. The electrical connector as described in claim 2, wherein the connector defines a receiving space between said pair of flanges and the inner PCB defines at least one electric device received in the receiving space.

5. The electrical connector as described in claim 1, wherein the second passageways extend into the base portion from the rear terminating face and are terminated near a front end of the base portion.

6. The electrical connector as described in claim 1, wherein the connector comprises at least one fastener for mounting corresponding board lock between the base portion and the inner PCB.

7. The electrical connector as described in claim 1, wherein the connector comprises a front shell mounting on the housing and surrounding the mating portion of the housing.

8. The electrical connector as described in claim 7, wherein the connector comprises a rear shell attached to the housing to cover the first and second contacts and the inner PCB received in the housing.

9. The electrical connector as described in claim 1, wherein the D-shaped mating portion is integral molded with the base portion.

10. The electrical connector as described in claim 1, wherein the base portion comprises a pair of post extending rearwardly to engage corresponding holes defined in the inner PCB.

11. An electrical connector comprising:

an insulative housing defining a front mating opening;

a plurality of first contacts located in an upper portion of the housing for mating with a complementary connector;

a plurality of second contacts located in a lower portion of the housing for mounting to a horizontal printed circuit board which is adapted to be located under a bottom face of the housing;

a vertical printed circuit board vertical located behind the first and second contacts; and a plurality of electronic components located on the vertical printed circuit board; wherein the first contacts are electrically connected to the second contacts, respectively, via said vertical printed circuit board, and the second contacts define connecting tails exposed to an exterior under the bottom face of the housing, said connecting tails being closed to the front mating opening, the housing defining a plurality of slots receiving the connecting tails of the second contacts therein and each of the slots being of a slit-like manner and penetrated into the housing inwardly from a rear face of the housing and also downwardly extending through a bottom face of the housing so as to allow the corresponding connecting tail to be inserted thereinto from the rear face with a mounting tip of said connecting tail extending downwardly beyond and below the bottom face.

12. The electrical connector as described in claim 11, wherein said first contact is dimensioned, in a front-to-back direction, to have a mating portion take most portions with a relatively short tail section connected to the vertical printed circuit board.

13. The electrical connector as described in claim 11, further including a pair of board locks located on two sides of the housing, and the vertical printed circuit is held by said pair of board locks.

14. The electrical connector as described in claim 13, wherein a metallic shield enclosed said housing including said pair of board locks and said vertical printed circuit board.

15. An electrical connector assembly comprising:

a horizontal printed circuit board;

an insulative housing defining a front mating port, and a bottom face seated upon the horizontal printed circuit board;

a plurality of contacts disposed in the housing and communicating with said front mating port, each of said contacts defining a tail section on a rear portion thereof;

a vertical printed circuit board vertical located behind the contacts and connected to said tail sections, and the vertical circuit board electrically connecting with the horizontal one; and a pair of board locks located on two sides of the housing, each of said board locks including a mounting leg extending around the bottom face and mounted to the horizontal printed circuit board, and a retention tab grasping said vertical printed circuit board in position.

16. An electrical connector assembly as claimed in claim 15, wherein the board locks are between the vertical printed circuit board and the housing, the retention tab extending rearwardly to grasp the vertical printed circuit board in the housing.

17. An electrical connector assembly as claimed in claim 15, further comprising a plurality of second contacts mounted in a lower portion of the housing, one end of the second contacts electrically connecting with the vertical printed circuit board and another end of which electrically connecting with the vertical printed circuit board.

* * * * *